(12) United States Patent
Butler et al.

(10) Patent No.: US 12,306,544 B2
(45) Date of Patent: May 20, 2025

(54) METROLOGY TOOL WITH POSITION CONTROL OF PROJECTION SYSTEM

(71) Applicants: ASML NETHERLANDS B.V., Veldhoven (NL); ASML HOLDING N.V., Veldhoven (NL)

(72) Inventors: Hans Butler, Best (NL); Arie Jeffrey Den Boef, Waalre (NL); Mark Constant Johannes Baggen, Eindhoven (NL); Jeroen Arnoldus Leonardus Johannes Raaymakers, Oirschot (NL); Richard Carl Zimmerman, Brookfield, CT (US)

(73) Assignees: ASML HOLDING N.V., Veldhoven (NL); ASML NETHERLANDS B.V., Veldhoven (NL)

( * ) Notice: Subject to any disclaimer, the term of this patent is extended or adjusted under 35 U.S.C. 154(b) by 218 days.

(21) Appl. No.: 18/026,115

(22) PCT Filed: Aug. 24, 2021

(86) PCT No.: PCT/EP2021/073400
§ 371 (c)(1),
(2) Date: Mar. 13, 2023

(87) PCT Pub. No.: WO2022/063508
PCT Pub. Date: Mar. 31, 2022

(65) Prior Publication Data
US 2023/0359127 A1 Nov. 9, 2023

Related U.S. Application Data

(60) Provisional application No. 63/084,052, filed on Sep. 28, 2020.

(51) Int. Cl.
*G03F 7/00* (2006.01)

(52) U.S. Cl.
CPC .... *G03F 7/70625* (2013.01); *G03F 7/706835* (2023.05)

(58) Field of Classification Search
CPC ........... G03F 7/70625; G03F 7/706835; G03F 7/70616
See application file for complete search history.

(56) References Cited

U.S. PATENT DOCUMENTS 10,635,003 B2 *  4/2020  Geuppert ............... G03F 7/7085
11,049,687 B2 *  6/2021  Takahashi ............... H01J 37/28
(Continued)

FOREIGN PATENT DOCUMENTS

EP        1085294        3/2001
JP        2008196976     8/2008
(Continued)

OTHER PUBLICATIONS

International Search Report and Written Opinion issued in corresponding PCT Patent Application No. PCT/EP2021/073400, dated Mar. 31, 2022.

(Continued)

*Primary Examiner* — Deoram Persaud
(74) *Attorney, Agent, or Firm* — Pillsbury Winthrop Shaw Pittman, LLP

(57) ABSTRACT

A metrology tool that includes a substrate table to hold a substrate; a projection system configured to project a beam on a target portion of the substrate; an actuator configured to adjust a position of the projection system relative to the substrate on the substrate table; a sensor configured to determine a position of the substrate table; and a one or more processors configured to: determine, based on the position of the substrate table, a position error of the substrate table with respect to a reference; and control, via the actuator, a position of the projection system to compensate for the (Continued)

position error of the substrate table so that the beam projects on the target portion of the substrate.

20 Claims, 9 Drawing Sheets

(56) References Cited

U.S. PATENT DOCUMENTS

| | | |
|---|---|---|
| 2008/0074629 A1 | 3/2008 | Groeneveld et al. |
| 2010/0195085 A1* | 8/2010 | Fuse ................ G03B 27/58 356/614 |
| 2011/0027704 A1 | 2/2011 | Cramer et al. |
| 2011/0043791 A1 | 2/2011 | Smilde et al. |
| 2011/0171759 A1 | 7/2011 | Butler et al. |
| 2011/0194088 A1* | 8/2011 | Butler ............ G03F 7/70258 355/77 |
| 2011/0261339 A1* | 10/2011 | Van Boxmeer ..... G03F 7/70616 355/77 |
| 2012/0044470 A1 | 2/2012 | Smilde et al. |
| 2012/0058434 A1* | 3/2012 | Khuat Duy ............ G02B 27/40 355/53 |
| 2012/0123581 A1 | 5/2012 | Smilde et al. |
| 2012/0242970 A1 | 9/2012 | Smilde et al. |
| 2013/0323651 A1* | 12/2013 | Solak ................ G03F 7/201 355/53 |
| 2014/0293251 A1* | 10/2014 | Butler ............... G03F 7/7055 355/55 |
| 2015/0062596 A1* | 3/2015 | Kwan ................ G03F 7/709 356/614 |
| 2015/0323872 A1* | 11/2015 | Van De Kerkhof ........................ G03F 7/70266 355/71 |
| 2016/0291479 A1 | 10/2016 | Feijen et al. |
| 2017/0184980 A1* | 6/2017 | Bogaart ............. G03F 7/70633 |
| 2018/0286724 A1 | 10/2018 | Xu |
| 2019/0108970 A1 | 4/2019 | Kato et al. |

FOREIGN PATENT DOCUMENTS

| | | |
|---|---|---|
| WO | 2009/078708 | 6/2009 |
| WO | 2009/106279 | 9/2009 |

OTHER PUBLICATIONS

J. M. M. Rovers et al., "Design and measurements of the Double Layer Planar Motor," in Electric Machines Drives Conference (IEMDC), 2013 IEEE International, pp. 204-211 (2013).

* cited by examiner

METROLOGY TOOL WITH POSITION CONTROL OF PROJECTION SYSTEM

CROSS-REFERENCE TO RELATED APPLICATIONS

This application is the U.S. national phase entry of PCT Patent Application No. PCT/EP2021/073400, which was filed on Aug. 24, 2021, which claims priority of U.S. Provisional Patent Application No. 63/084,052, which was filed on Sep. 28, 2020, and which is incorporated herein in its entirety by reference.

TECHNICAL FIELD

The description herein relates generally to a metrology tool used in a semiconductor manufacturing set up including a lithographic apparatus. More particularly, improvements related to positioning of the metrology tool.

BACKGROUND

A lithographic projection apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Multiple layers, each having a particular pattern and material composition, are applied to define functional devices and interconnections of the finished product.

Current and next generation processes often rely on so-called multiple patterning techniques to produce device features having dimensions far smaller than can be printed directly by the lithographic apparatus. Multiple patterning steps, each having its own mask or reticle, are performed to define a desired device pattern in a single layer on the substrate. Many different examples of multiple patterning are known. In some processes, a regular, grid structure is formed as a basis for the desired device pattern. Then using a circuit-specific mask pattern, lines that form the grid structure are cut at specific locations to separate the lines into individual segments. The grid structure may be exceptionally fine in dimensions, with a pitch in the tens or even teens of nanometers.

In a lithographic process, it is desirable frequently to make measurements of structures created, e.g., for process control and verification. Various tools for making such measurements are known, including scanning electron microscopes, which are often used to measure critical dimension (CD), and specialized tools to measure overlay (the accuracy of alignment of two layers of a substrate) or focus. Final performance of manufactured device may depend critically on the accuracy of positioning and dimensioning of the cut mask relative to the grid structure. (The cut mask in this context is what defines the circuit-specific locations at which the grid structure is modified to form functional circuits). Overlay error may cause cutting or other modification to occur in a wrong place. Dimensional (CD) errors may cause cuts to be too large, or too small (in an extreme case, cutting a neighboring grid line by mistake, or failing to cut the intended grid line completely).

Other performance parameters of the lithographic process may be also of interest, for example in optical lithography parameters of focus and exposure dose may also require measuring.

It is proposed that lithographic apparatuses comprise integrated metrology systems able to make such measurements of performance parameters. However, integration of such metrology systems can have a throughput impact on the lithographic apparatus as a whole or on the metrology system. The integration may also have an impact on the sampling performance, i.e. the quantity of successfully sampled substrates, of the lithographic apparatus. Such impacts may be difficult to predict.

SUMMARY

According to an embodiment, there is provided a metrology tool. The metrology tool includes a substrate table; a projection system, and one or more processors (also referred as controllers) configured to control a position of the projection system. In an embodiment, there is provided, a metrology tool that includes a substrate table to hold a substrate; a projection system configured to project a beam on a target portion of the substrate; an actuator configured to adjust a position of the projection system relative to the substrate on the substrate table; a sensor configured to determine a position of the substrate table; and a controller configured to: determine, based on the position of the substrate table, a position error of the substrate table with respect to a reference; and control, via the actuator, a position of the projection system to compensate for the position error of the substrate table so that the beam projects on the target portion of the substrate. The controller can be in an open-loop configuration wherein a position feedback related the projection system is not received. In an embodiment, the controller can be in a closed-loop configuration wherein a position feedback related to the position of the projection system is received.

Controlling position of the projection system allows removal of a short-stoke stage of the substrate table and only a single stroke stage may be employed. According to the present disclosure, the position control of the projection system compensates for the errors in the long-stroke positioning of the substrate table. According to present disclosure, a positioning system includes less number of component compared to existing positioning system (e.g., substrate table having long-stroke and short-stoke stage). Also, a faster positioning of the metrology tool over a target portion of the substrate can be achieved thereby improving the metrology time and throughput of the patterning process.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Before describing embodiments in detail, it is instructive to present an example environment in which embodiments may be implemented.

Figure 1:
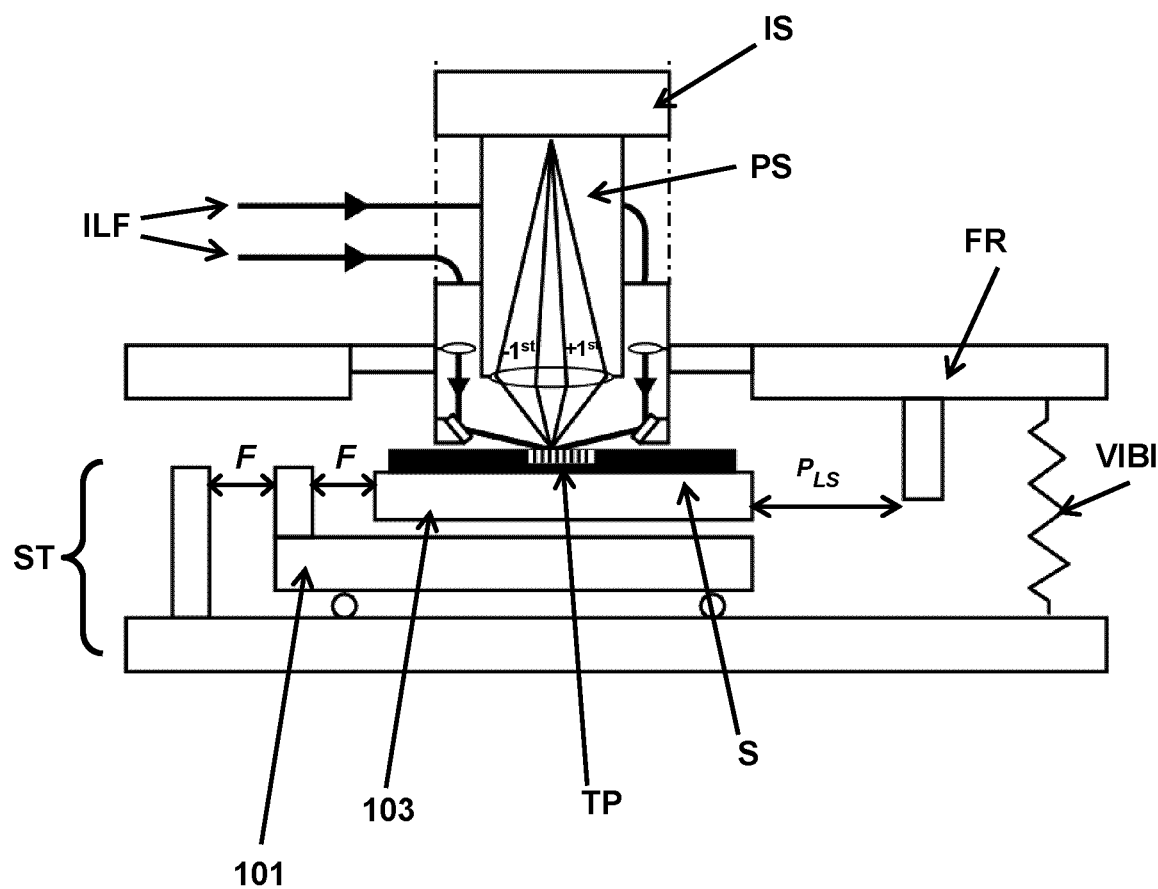
FIG. 1 illustrates an existing metrology tool including a long-stroke and a short-stroke stages of a substrate table configured to move such that a substrate is positioned at a target position under a projection system.

FIG. 1 is a schematic of a metrology tool used to measure a substrate placed on a substrate table. For example, the metrology tool is used to measure a patterned substrate, e.g., patterned via a lithography apparatus. The metrology tool can be a standalone tool, or integrated into the semiconductor manufacturing facility with lithographic apparatus (e.g., see FIG. 9). The metrology tool can be, for example, a diffraction tool (e.g., ASML YieldStar or diffraction phase microscopy), an electron microscope, or other suitable inspection tool (e.g., FIG. 6 and FIG. 7) configured to measure the patterned substrate. Additional examples of the metrology tools and their working principles are discussed in PCT applications WO 2009/078708 and WO 2009/106279 which documents are hereby incorporated by reference in their entirety. Further developments of the technique have been described in published patent publications US20110027704A, US20110043791A, US20120044470 and US2012/0123581. The contents of all these applications are also incorporated herein by reference. The detailed working principle of the metrology tool is omitted herein for brevity.

In an example, referring to FIG. 1, a light source generates an optical beam that is passed through illumination fibers ILF (also referred as optical fibers) into a projection system PS and onto a substrate S to be measured. Furthermore, the metrology tool includes an image sensor IS configured to capture diffracted light (e.g., 1st order diffractions) from the substrate S. In an embodiment, the projection system may include various types of optical components, such as refractive, reflective, or other types of optical components, or any combination thereof, for directing, or controlling a beam on to the substrate.

In the present example, the metrology tool can capture an image of the patterned substrate for which accurate alignment with the substrate is desired. The metrology tool must be accurately positioned so that a beam (e.g., optical or e-beam) from the metrology tool may be projected at a target portion TP of the patterned substrate S. For such positioning, the existing technology includes a positioning mechanism that performs an initial coarse positioning followed by a fine positioning.

In the present technology, the positioning mechanism comprises a first portion 101 (also referred as a long-stroke portion) and a second portion 103 (also referred as a short-stroke portion) configured to perform a long-stroke and short-stroke movement of a substrate table ST holding the patterned substrate S. In an embodiment, the long-stroke portion 101 can be coupled to a first actuator such as a motor, an electro-magnetic linear or non-linear actuators, or other actuators. The short-stroke portion 103 is located on top of the long-stroke portion 101 and the substrate S is placed on top of the short-stroke portion 103. The short-stoke portion 103 can be coupled to a second actuator configured to further move the substrate S to a desired location below the projection system PS with respect to the long-stroke portion 101. It can be understood by a person of ordinary skill in the art that the long-stroke and short-stoke structure in FIG. 1 is an example illustration, and not limiting. The short-stroke portion 103 may not be necessarily be placed on top of the long-stroke portion 101. For example, the long-stroke and short stroke portions may be places alongside each other.

In FIG. 1, the long-stroke portion 101 and the short-stroke portion 103 operate together to position, with sufficient accuracy, the substrate S under a projection system PS of the metrology tool. In a step-like fashion, the portions of substrate table ST are moved from one location to the next to achieve ±2 um accuracy with respect to the projection system PS. The positioning mechanism includes a long-stroke actuator (attached to 101) to move the substrate table by a first amount, a short-stroke actuator (attached to 103) to move the substrate table by a second amount, and one or more sensors (not shown) to determine a position of the substrate table ST. For example, the first amount of movement can be up to 300 mm with an accuracy of ±300 µm with respect to a desired position, and the second amount of movement is relatively less than the first amount of movement while maintaining an accuracy of approximately ±2 µm with respect to a desired position or a target position. In an embodiment, the position of the substrate table can be defined in rectangular ordinates or polar coordinates specified with respect to a target position, for example. In general, the long-stroke positioning may be referred as a coarse positioning and a short-stroke positioning is referred as fine positioning. The long-stroke/short-stroke mechanism is expensive and complex. The short-stroke actuator has to provide larger and larger forces when increasing stage accelerations.

In the present disclosure, there is provided a metrology tool configured to replace the short-stroke portion 103 by driving the projection system PS to compensate for the long-stroke settling error after each positioning step. Hence, according to an embodiment, the substrate table will have a long stroke portion only (e.g., a long-stroke motor only), reducing complexity and cost of the positioning mechanism. The projection system PS of the metrology tool is substantially different from a projection system of the lithographic apparatus. For example, the projection system of the lithographic apparatus includes very complex and heavy optics. Such projection systems are maintained substantially in a stationary state to accurately pattern a substrate. Moving the projection system of the lithographic apparatus may cause misalignment of optical components (e.g., array of mirrors) that may negatively affect a patterning performance of the lithographic apparatus. Also, the projection system of the lithographic apparatus substantially heavier than a projection system of the metrology apparatus. Due to a lighter mass of the projection system of the metrology tool, it is possible to move the projection system of the metrology tool without affecting the performance of the metrology tool.

In the present disclosure, an actuator such as piezoelectric actuator drives the projection system PS. The actuator can be driven by an open control loop or a closed control loop configured to detect a positioning error and compensate for the positioning error of the long-stroke portion 101. Accordingly, the control loop can generate movement signal to drive the actuator for accurately positioning the projection system PS within a plane of the substrate S. In an embodiment, the projection system PS is coupled to a vibration isolator VIBI to dampen vibrations caused due to movement of the substrate table ST and/or the projection system PS. In an embodiment, the actuator may be coupled to the metrology frame FR and further coupled to the projection system PS (e.g., see FIG. 2).

In an embodiment, the actuator can be driven by a controller (e.g., a processor) in an open loop control configuration, which sends a positioning command to the actuator but there is no active position (of the projection system) feedback. In another embodiment, the projection system PS and a sensor may be used to re-calibrate the actuator on a regular basis (e.g. once per wafer). In an embodiment, an image sensor is used in a closed-loop configuration of a control system. Example implementations of a control system are discussed in detail below. For example, the metrology system employs moving the short-stroke portion to the projection system PS, the short-stroke may be achieved by including a position feedback loop, or by removing the position feedback loop.

In an embodiment, the "control system" includes one or more processors configured to control a position of the projection system and/or the substrate table. In some embodiment, the one or more processor are also referred as a controller. The functions of the control system may be implemented on a single processor, or distributed across different processors. In an embodiment, the control system may include additional components such as a position sensor, an actuator, or other components interacting with the one or more processor. The control system can be in an open loop configuration or closed loop configuration depending on the type of inputs used to determine a control command to move the projection system and/or the substrate table.

Figure 2:
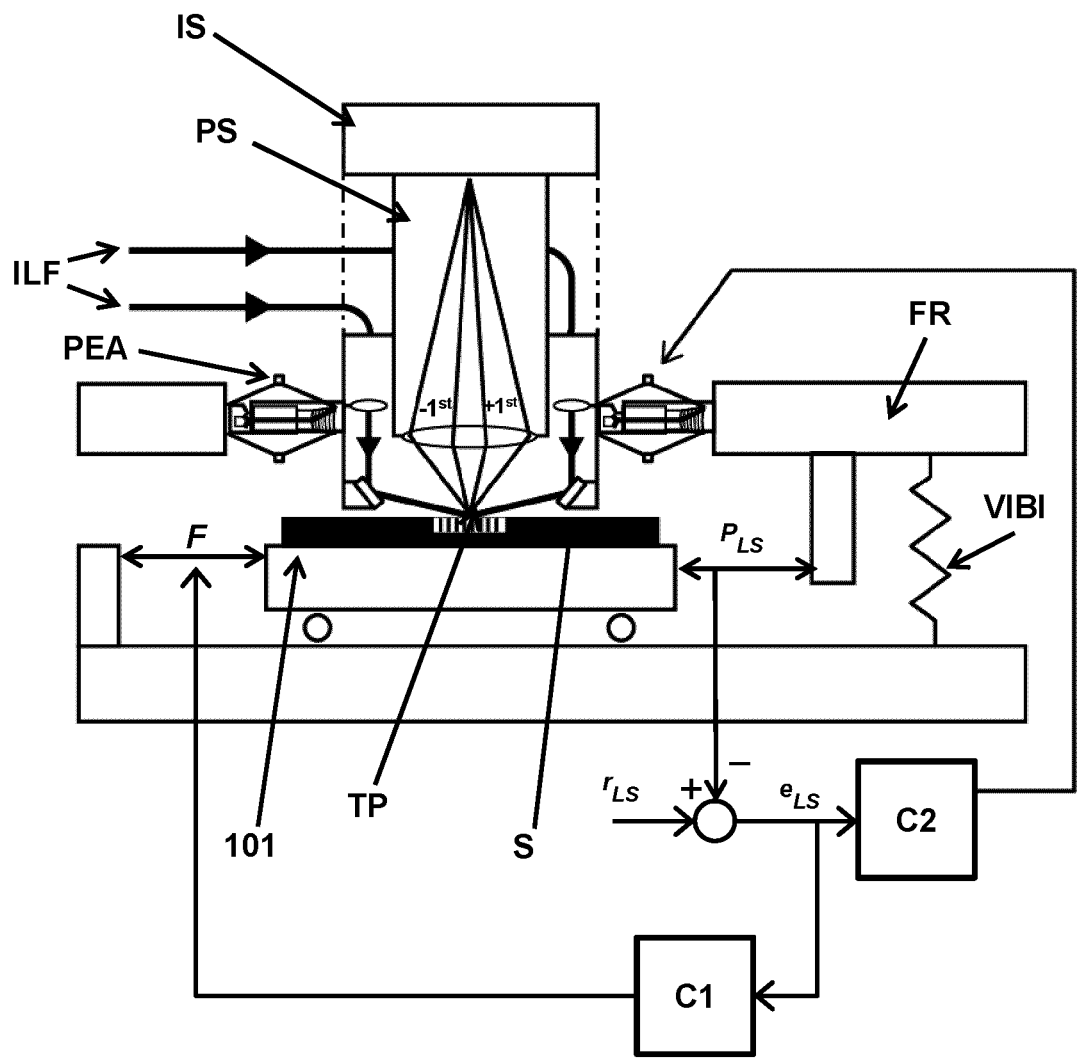
FIG. 2 schematically depicts an embodiment of a metrology tool including an open-loop controller and an actuator configured to move a projection system relative to the substrate table, according to an embodiment.

FIG. 2 illustrates an exemplary metrology tool including a projection system PS and an open-loop (e.g., feed-forward only) control system. Within the open loop, the long stroke portion 101 may be driven by a first controller C1 and a piezo actuator PEA is driven by a second controller C2. In an embodiment, the controller C1 determines a force F by which the long stroke portion 101 of the substrate table ST be driven to achieve a long-stroke position of e.g. 1-300 mm with an accuracy of 10-100 um. For example, the substrate table ST is moved to a position $P_{LS}$. In an embodiment, the position may be specified in rectangular coordinates such as $X_1, Y_1$.

In an embodiment, the position $P_{LS}$ of the substrate table ST may be measured by a position sensor (e.g., an interferometric device, linear encoder or capacitive sensor). Based on the position $P_{LS}$ of the substrate table ST, a positioning error $e_{LS}$ may be determined with respect to a target position $r_{LS}$. In an embodiment, the target position refers to a location at which the projection system is accurately aligned with the target portion TP of the substrate. In an embodiment, the position of the substrate table may be provided with respect to the frame FR on which the projection system is mounted.

The control system comprises the second controller C2 that receives the positioning error $e_{LS}$ as input and generates a signal to drive the actuator PEA to decrease an error of the projection system with respect to the substrate. For example, PEA moves the projection system to be within within the desired threshold (e.g., ±2 μm) with respect to the target portion of the substrate. The signal is indicative of a position to which the projection system PS be moved in order to compensate for the positioning error $e_{LS}$ of the substrate table.

In an embodiment, the second controller C2 comprises a gain or other tuning parameters that are determined based on the position error $e_{LS}$ and a response of the actuator PEA so that appropriate movement signal can be generated by the second controller C2. In an embodiment, the response of the actuator PEA can be a function of behavioral characteristics of the piezo actuator, and characteristics (e.g., mass) of the projection system PS. In an embodiment, the gain or other control parameter can depend on the type of controller used. For example, the controller C2 include a gain controller with a filter, for example. The present disclosure is not limited to the aforementioned control type and other type of controllers may be used within the scope of the present disclosure.

In an embodiment, the actuator PEA is coupled around a circumference of the projection system PS. In an embodiment, the projection system PS may be mounted on a plurality of mounts (not illustrated) arranged circumferentially around the projection system PS. Thus, the projection system PS is capable of being moved, via the actuator PEA, in different directions including X, Rx, Y, or Ry so that the beam can be accurately projected on the target portion TP of the substrate S.

In the present example, the second controller C2 does not track the position of the projection system PS. Hence, the control loop including the controller C2 can be referred as an open-loop control or feed forward control.

Figure 3:
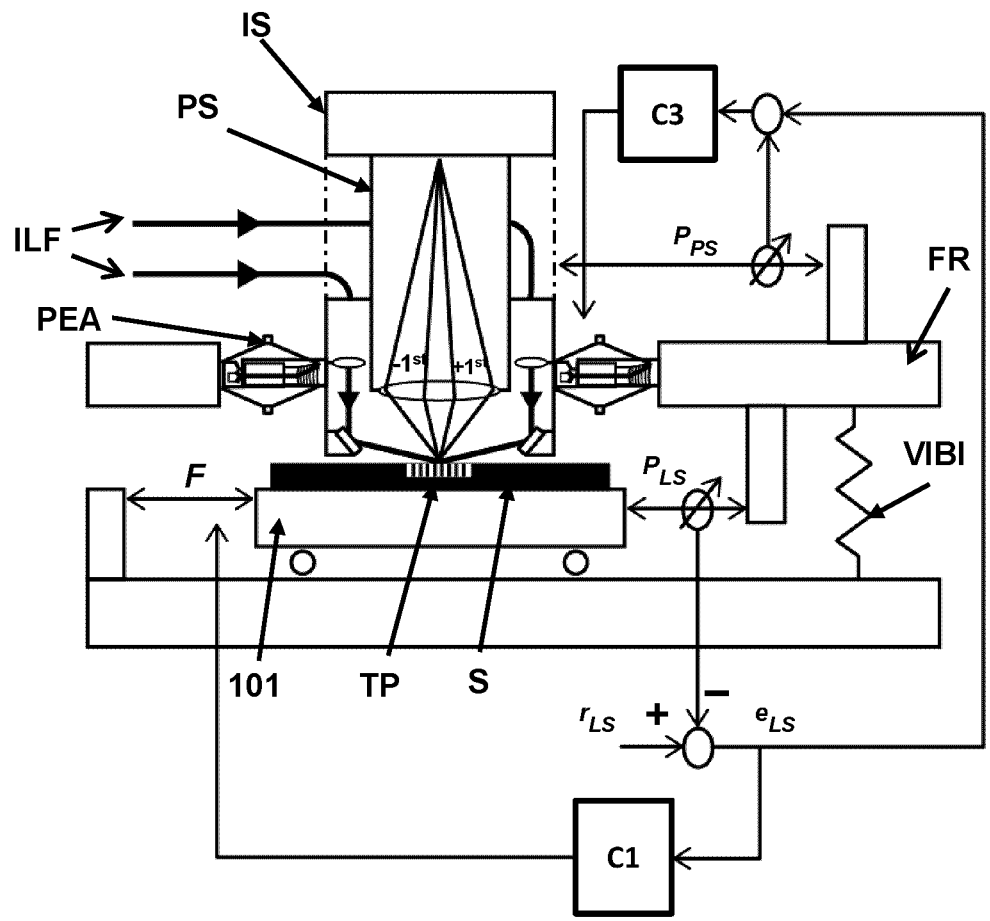
FIG. 3 schematically depicts an embodiment of a metrology tool including a closed-loop controller, a position sensor, and an actuator configured to move a projection system relative to the substrate table, according to an embodiment.

FIG. 3 illustrates exemplary metrology tool implementing another control system comprising the controller C1, a third controller C3, and a position sensor (not explicitly illustrated) configured to determine a position of the projection system PS and accordingly control positioning of the projection system PS. In an embodiment, the position sensor can be located on the frame FR (or the projection system PS). The position sensor can measure a distance between the projection system and a location on the frame or vibration isolator VIBI to determine a position $P_{PS}$ of the projection system PS.

As mentioned earlier, the controller C1 functions in the same manner as discussed with respect to FIG. 2. The controller C1 determines a force F by which the long stroke portion 101 of the substrate table ST be driven to achieve a long-stroke position (e.g., move by 1 mm-300 mm) of the substrate table.

The third controller C3 drives a piezo actuator PEA based on both the position error $e_{LS}$ of the substrate table and a current position $P_{PS}$ of the projection system PS. Based on both the position error eLs and the current position Pps, the controller C3 generates a signal to drive the actuator PEA such that position of the projection system is within the desired threshold (e.g., ±2 μm) of the target position. The position information $P_{PS}$ of the projection system PS is the feedback received by the controller C3 for its movement signal. Hence, the controller C3 may be considered to be in a closed loop. The controller C3's movement signal is indicative of a position to which the projection system PS be moved, given the current position $P_{PS}$ of the projection system PS. The controller C3's reference or requested amount of movement of PS is the long-stroke position error $e_{LS}$. The current position of PS is equal to $P_{PS}$. Then, a difference between the reference $e_{LS}$ and the current position $P_{PS}$ is the input to controller C3, which will attempt to bring this difference to zero.

In an embodiment, the third controller C3 also comprises a gain or other tuning parameters that are determined based on the position error $e_{LS}$, the current position $P_{PS}$ of the projection system PS, and a response of the actuator PEA so that appropriate signal can be generated by the third controller C3. In an embodiment, the response of the actuator PEA can be a function of behavioral characteristics of the piezo actuator, the position of the projection system PS, and characteristics (e.g., mass) of the projection system PS. Similar to the second controller C2, the tuning parameters of the controller C3 can be a gain or other control parameter. The controller C3 can be a proportional (P) control, an integral (I) control, a derivative (D) control, a PI control, a PID control, or a combination thereof. The present disclosure is not limited to the aforementioned control type and other type of controllers may be used within the scope of the present disclosure.

As mentioned earlier, the actuator PEA is coupled around a circumference of the projection system PS and is capable of being moved, via the actuator PEA, in different directions including X, Rx, Y, or Ry so that the beam can be accurately projected on the target portion TP of the substrate S.

Figure 4:
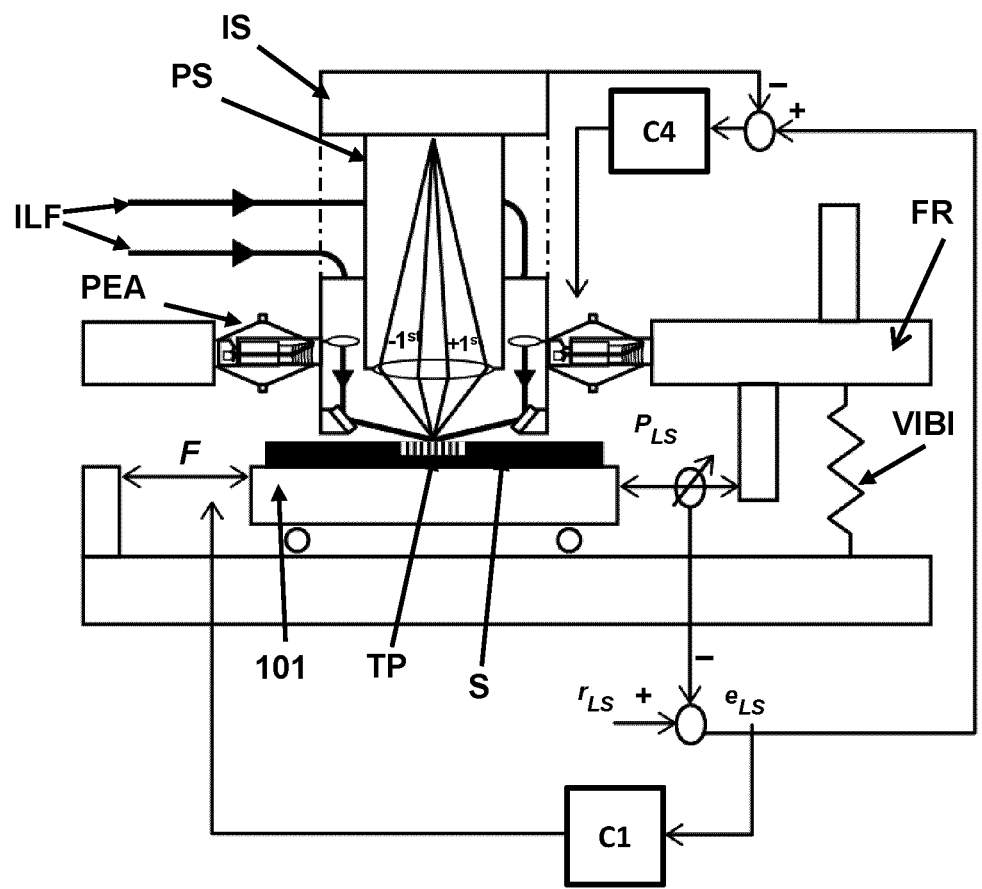
FIG. 4 schematically depicts an embodiment of a metrology tool including another controller and an actuator configured to move a projection system relative to the substrate table, according to an embodiment.

According to the present disclosure, the use of the actuator PEA may be subjected to a drift (e.g., Piezo drift) in performance of the actuator. For example, referring to FIG. 2, the Piezo drift may cause a positioning error that slowly varies in time. Hence, a regular calibration using an independent measurement system may be implemented to compensate for the drift. One way to implement the drift compensation is to use the image sensor IS itself, which is capable of accurate position measurements, for example using a target portion TP on the substrate S. FIG. 4 illustrates an example implementation of the control loop using the image sensor IS data.

The capability of the image sensor IS can be used in two ways. First, regularly (e.g. once per substrate) calibrating the actuator position and control loop gain by inspecting a target portion on the substrate using an image sensor (e.g., Yieldstar sensor). Second, creating an extra outer control loop at a lower sampling rate (e.g. 80 Hz, supported by the sensor). As a main advantage, this control loop measures the true substrate position, without additional sensor hardware. For example, in FIG. 4, a fourth controller C4 can be part of the extra outer control loop that receives an input from the image sensor IS in addition to the position error $e_{LS}$ of the substrate table.

In an embodiment, the extra outer control loop is an open-loop control, where the piezo-driven projection system PS compensates for the long-stroke position error eLs, without position feedback loop but using the image sensor IS itself for slow piezo compensation. The extra control loop solution provides a low-cost alternative for the existing long-stroke/short-stroke positioning mechanism. According to present disclosure, not only the actuators, but also some of the sensors may be removed from the existing system.

When using tuned control parameters (e.g., gains of the controller), the piezo capability of compensating for the long stroke settling error is better than existing technology. For example, results have shown that a settling time of approximately 18 millisecond for long stroke of an existing technology is reduced to approximately 5 millisecond using piezo tracking with 2 μm or better positioning accuracy.

Figure 5:
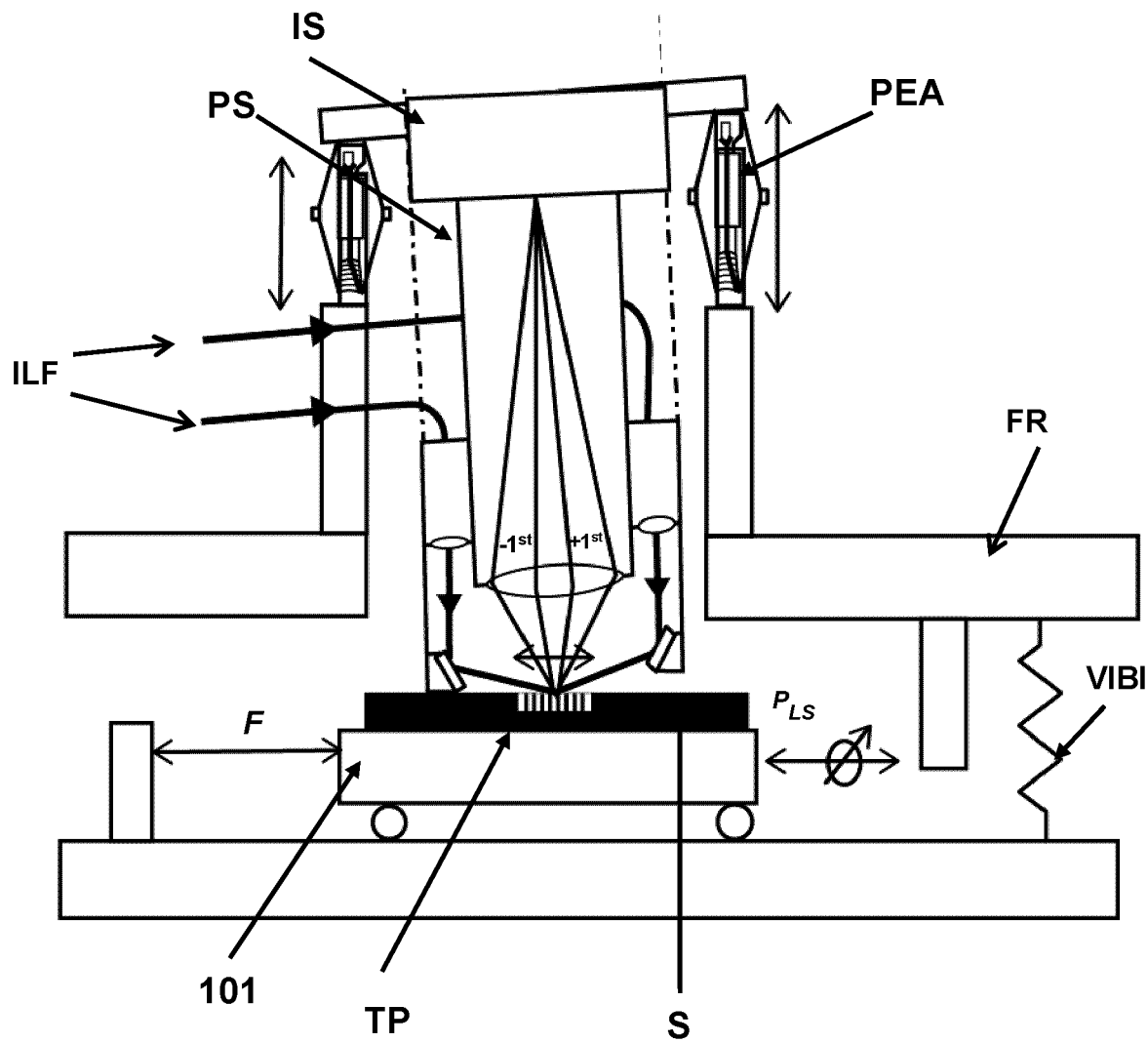
FIG. 5 schematically depicts an embodiment of a metrology tool including a controller and an actuator configured to move a projection system relative to the substrate table, according to an embodiment.

FIG. 5 illustrates another exemplary implementation of an actuator configured to position the projection system PS. In FIG. 5, the piezo actuator PEA may be located in such a way to rotate the projection system PS around a point located at a top of the projection system. This would reduce the required range of movement of the piezo actuator PEA. The description of control loop used in this example is omitted for brevity. Any type of control loop including controller such as C1, C2, C3, and C4, may be tuned for the arrangement (in FIG. 5) in the similar manner as discussed earlier.

In an embodiment, instead of moving the full set of optics of the projection system PS, only a part of the optics may be moved. For example the illumination fibers ILF and bottom lens element may be moved. This further reduces the mass to be moved, and simplifies the implementation of the long stroke compensation.

As discussed above, the present disclosure provides metrology tools in FIGS. 2-5. Referring to an example FIG. 2, a metrology tool includes a substrate table to hold a substrate S (e.g., a patterned substrate to be measured); a projection system PS configured to project a beam on a target portion TP of a substrate S; an actuator PEA configured to adjust a position of the projection system PS relative to the substrate S on a substrate table ST; a sensor (not explicitly illustrated) configured to determine a position $P_{LS}$ of the substrate table ST; and one or more processors. The one or more processors (e.g. a controller C2) is configured to determine, based on the position $P_{LS}$ of the substrate table, a position error $e_{LS}$ of the substrate table ST with respect to a target $r_{LS}$; and control, via the actuator PEA, a position of the projection system to compensate for the position error $e_{LS}$ of the substrate table ST so that the beam projects on the target portion of the substrate. The one or more processors is further configured to move, via another actuator, the substrate table to a first position. For example, the another actuator (not explicitly illustrated) is represented by a force F that is applied by the actuator to the substrate table 101.

In an embodiment, the substrate table portion 101 is moved with an accuracy of ±300 μm with respect to a target position.

In an embodiment, the one or more processors (e.g., controller C2) is configured to: determine, based on the first position, the position error of the substrate table with respect to the target position; determine, based on the position error, an adjustment amount by which the projection system be moved to compensate for the position error of the substrate; and control, via the actuator, the position of the projection system by the adjustment amount. In an embodiment, the position of the projection system is controlled with an accuracy of ±2 μm.

In an embodiment, referring to FIG. 3, the metrology tool may further comprise: another sensor (e.g., a position sensor) configured to determine a position $P_{PS}$ of the projection system with respect to the frame FR. In an embodiment, the one or more processors (e.g., controller C3) is further configured to control, based on the position error $e_{LS}$ of the substrate table and the position $P_{PS}$ of the projection system, the position of the projection system to compensate for the position error of the substrate table so that the beam projects on the target portion of the substrate. In an embodiment, the position of the projection system is controlled with an accuracy of ±2 μm.

In an embodiment, referring to FIG. 4, the projection system is configured to capture an image of the target portion of the substrate; and the one or more processors (e.g., controller C4) is further configured to: determine, based on the image, a position of the projection system relative to the target portion of the substrate; and control, based on the position error of the substrate table and the determined position of the projection system, the position of the projection system to compensate for the position error of the substrate table so that the beam projects on the target portion of the substrate. In an embodiment, the position of the projection system is controlled with an accuracy of ±2 µm with respect to the target position.

The actuator PEA can be a piezo-electric actuator, a Lorentz actuator, or other linear or non-linear actuators. The present disclosure is not limited to a particular actuator type. In an embodiment, the actuator is configured to control the position of the projection system within a plane of the substrate. In an embodiment, the actuator is configured to move the projection system in a linear direction, for example, an x-direction and/or a y-direction within a plane of the substrate. In an embodiment, the actuator is positioned to move the projection system in an angular direction by tilting the projection system to cause the beam to project at the desired location within a plane of the substrate.

In an embodiment, the one or more processors (e.g., controllers C1, C2, C3, and C4) is at least one of: a proportional (P) controller configured to determine an adjustment amount by which the projection system be moved to compensate for the position error of the substrate table; an integral (I) controller configured to determine the adjustment amount by which the projection system be moved to compensate for the position error of the substrate table; a differential (D) controller configured to determine the adjustment amount by which the projection system be moved to compensate for the position error of the substrate table; or a PID controller configured to determine the adjustment amount by which the projection system be moved to compensate for the position error of the substrate table.

The skilled artisan will appreciate that, in the context of such alternative applications, any use of the terms "substrate" or "target portion" referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultraviolet (EUV) radiation (e.g. having a wavelength in the range of 5-20 mn), as well as particle beams, such as ion beams or electron beams.

The tern "lens", where the context allows, may refer to any one or combination of various types of optical components, including refractive, reflective, magnetic, electromagnetic and electrostatic optical components.

Figure 6:
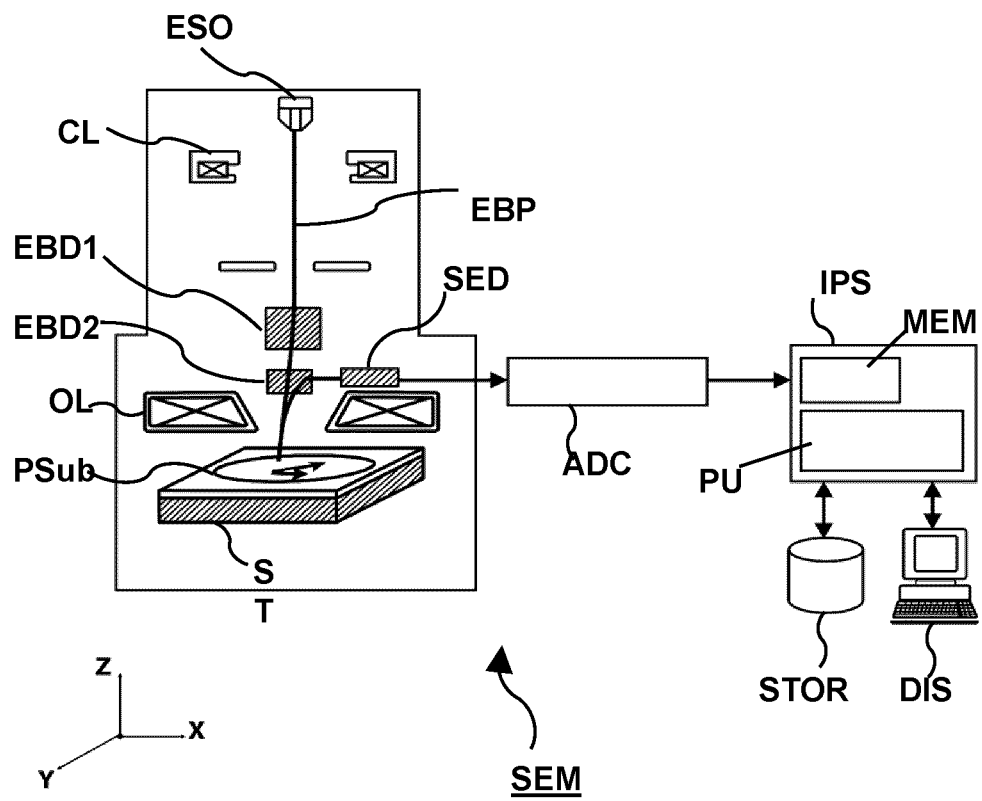
FIG. 6 schematically depicts an embodiment of a scanning electron microscope (SEM), according to an embodiment.

In some embodiments, the inspection apparatus or the metrology tool may be a scanning electron microscope (SEM) that yields an image of a structure (e.g., some or all the structure of a device) exposed or transferred on the substrate. FIG. 6 depicts an embodiment of a SEM tool. A primary electron beam EBP emitted from an electron source ESO is converged by condenser lens CL and then passes through a beam deflector EBD1, an E×B deflector EBD2, and an objective lens OL to irradiate a substrate PSub on a substrate table ST at a focus.

When the substrate PSub is irradiated with electron beam EBP, secondary electrons are generated from the substrate PSub. The secondary electrons are deflected by the E×B deflector EBD2 and detected by a secondary electron detector SED. A two-dimensional electron beam image can be obtained by detecting the electrons generated from the sample in synchronization with, e.g., two dimensional scanning of the electron beam by beam deflector EBD1 or with repetitive scanning of electron beam EBP by beam deflector EBD1 in an X or Y direction, together with continuous movement of the substrate PSub by the substrate table ST in the other of the X or Y direction.

A signal detected by secondary electron detector SED is converted to a digital signal by an analog/digital (A/D) converter ADC, and the digital signal is sent to an image processing system IPU. In an embodiment, the image processing system IPU may have memory MEM to store all or part of digital images for processing by a processing unit PU. The processing unit PU (e.g., specially designed hardware or a combination of hardware and software) is configured to convert or process the digital images into datasets representative of the digital images. Further, image processing system IPU may have a storage medium STOR configured to store the digital images and corresponding datasets in a reference database. A display device DIS may be connected with the image processing system IPU, so that an operator can conduct necessary operation of the equipment with the help of a graphical user interface.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other pattering processes, the structure may be a device or a portion thereof that is being manufactured and the images may be SEM images of the structure. In some instances, the structure may be a feature of semiconductor device, e.g., integrated circuit. In this case, the structure may be referred as a pattern or a desired pattern that comprises a plurality of feature of the semiconductor device. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

Figure 7:
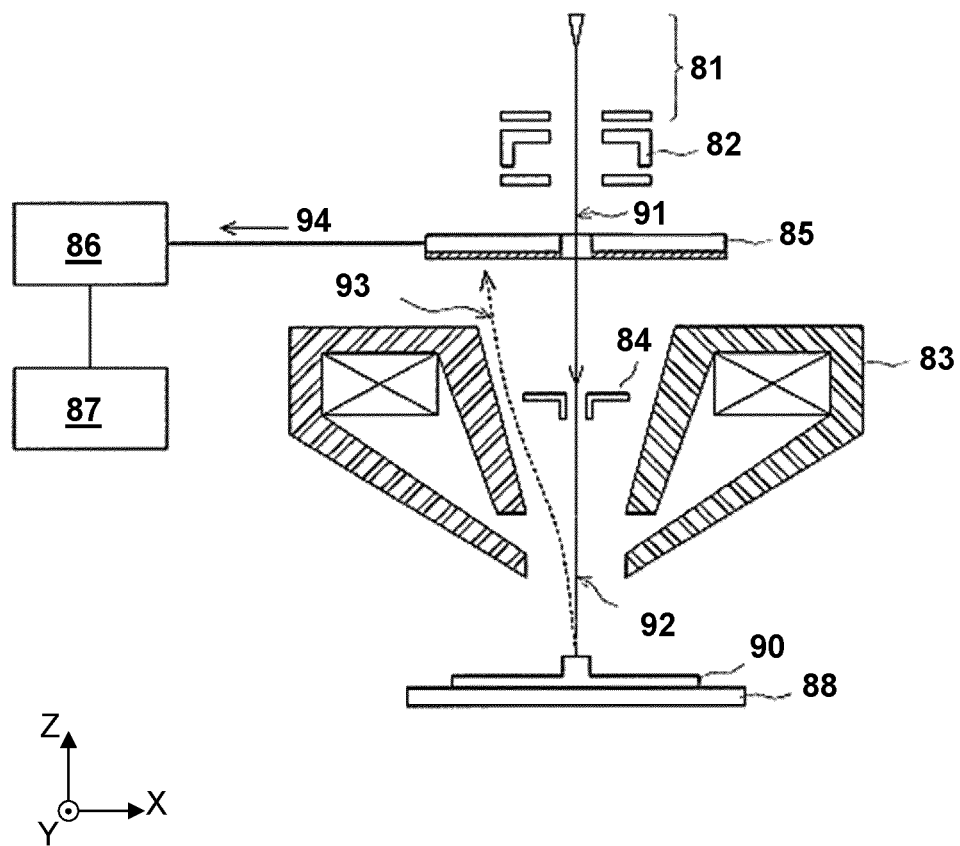
FIG. 7 schematically depicts an embodiment of an electron beam inspection apparatus, according to an embodiment.

FIG. 7 schematically illustrates a further embodiment of an inspection apparatus. The system is used to inspect a sample 90 (such as a substrate) on a sample stage 88 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 88. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 6 that uses a probe to inspect a substrate, the electron current in the system of FIG. 7 is significantly larger compared to, e.g., a CD SEM such as depicted in FIG. 6, such that the probe spot is large enough so that the inspection speed can be fast. However, the resolution may not be as high as compared to a CD SEM because of the large probe spot. In an embodiment, the above discussed inspection apparatus may be single beam or a multi-beam apparatus without limiting the scope of the present disclosure.

The SEM images, from, e.g., the system of FIG. 6 and/or FIG. 7, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

In an embodiment, the one or more functions of controllers (e.g., C1, C2, C3, and C4) can be implemented as instructions (e.g., program code) in a processor (e.g., processor PRO) integrated into the metrology tool or a processor of a computer system (e.g., processor PRO of computer system CS) communicable coupled to the metrology tool. In an embodiment, the functions may be distributed across a plurality of processors (e.g., parallel computation) to improve computing efficiency. In an embodiment, the computer program product comprising a non-transitory computer readable medium has instructions recorded thereon, the instructions when executed by a computer hardware system implementing the functions of the controller described herein.

According to present disclosure, the combination and sub-combinations of disclosed elements constitute separate embodiments. For example, a first combination comprises a metrology tool with a second controller C2, and a second combination comprises a metrology tool with a third controller C3.

Figure 8:
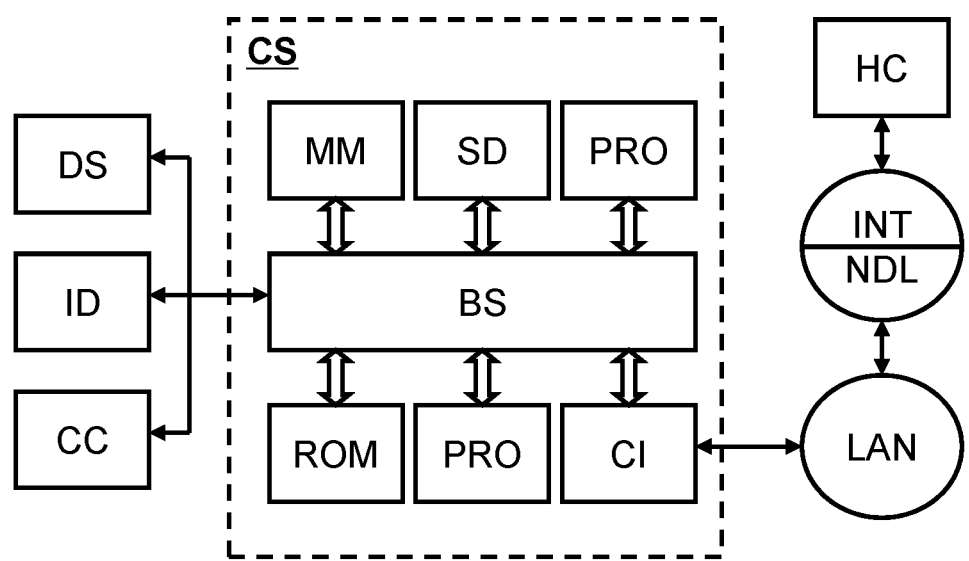
FIG. 8 is a block diagram of an example computer system, according to an embodiment.

FIG. 8 is a block diagram of an example computer system CS, according to an embodiment. Computer system CS includes a bus BS or other communication mechanism for communicating information, and a processor PRO (or multiple processor) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 9:
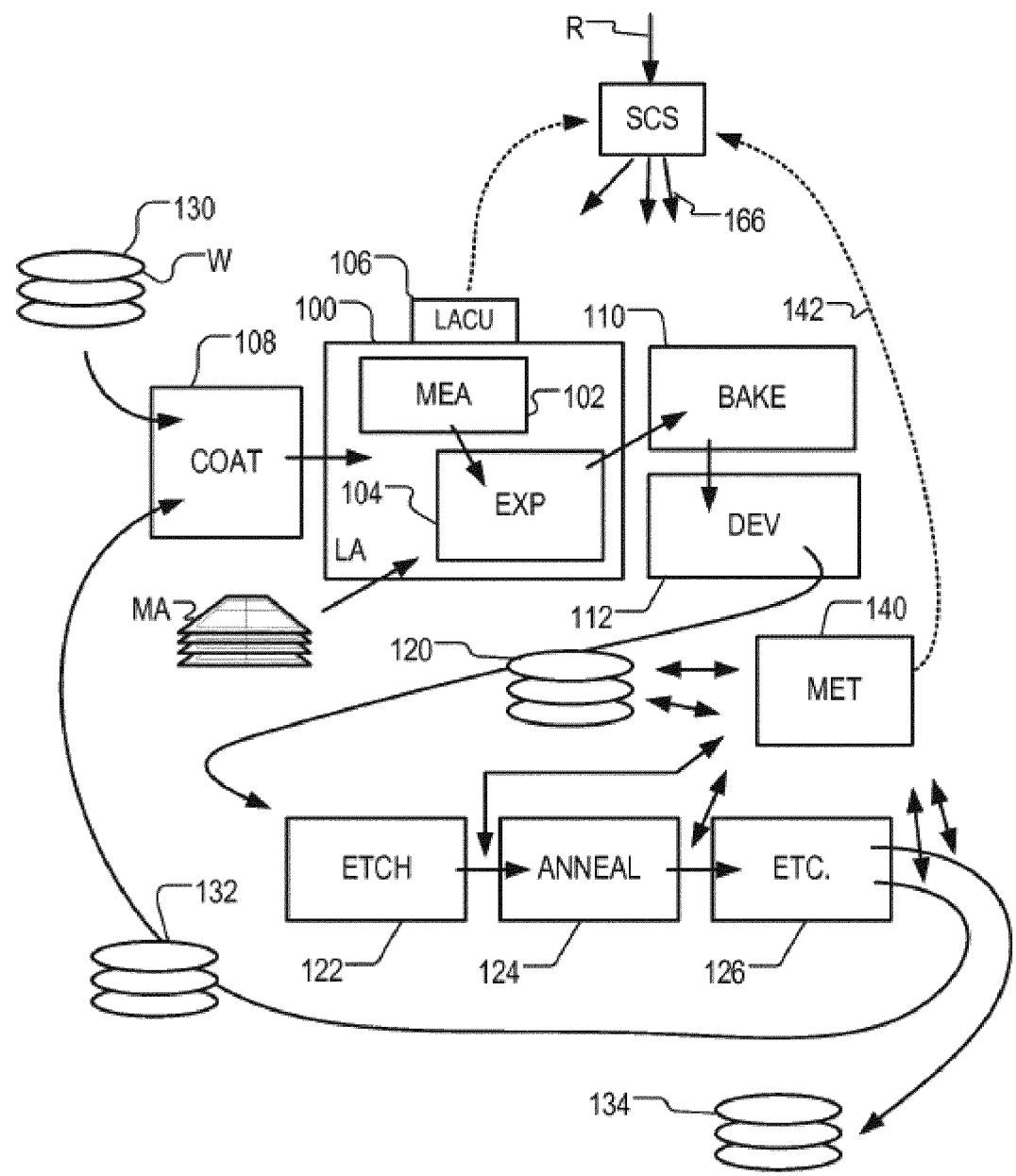
FIG. 9 depicts a lithographic apparatus together with other apparatuses forming a production facility for semiconductor devices.

FIG. 9 at 100 shows a lithographic tool LA as part of an industrial production facility implementing a high-volume, lithographic manufacturing process. In the present example, the manufacturing process is adapted for the manufacturing of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic tool (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic tool LA may for example be a so-called dual stage type which has two substrate tables and two stations—an exposure station and a measurement station—between which the substrate tables can be exchanged.

Within the production facility, lithographic tool 100 forms part of a lithographic apparatus, otherwise referred to as a "litho cell" or "litho cluster", that contains also a coating apparatus 108 for applying photosensitive resist and other coatings to substrates W for patterning by the lithographic tool 100. At an output side of lithographic tool 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which may also control (partially) the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 9 is a metrology system 140 which is provided for making measurements of parameters of the products at desired stages in the manufacturing process. A common example of a metrology system in a modern lithographic production facility is a scatterometer, for example an angle-resolved scatterometer or a spectroscopic scatterometer, and it may be applied to measure properties of the developed substrates at 120 prior to etching in the apparatus 122. Using metrology system 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. The metrology results 142 from the metrology system 140 can be used to maintain accurate performance of the patterning operations in the litho cluster, by supervisory control system SCS and/or control unit LACU 106 making small adjustments over time, thereby minimizing the risk of products being made out-of-specification, and requiring re-work.

Increasingly, apparatus such as metrology system 140 are integrated within the lithographic apparatus 100, providing integrated metrology within the lithographic process. However, this integration can result in a throughput or productivity impact of the whole lithographic apparatus which can be difficult to predict. Additionally, the sampling of substrates within the integrated apparatus may be insufficient, as it can be difficult for the metrology system to keep up with the lithographic tool output.

It is therefore proposed to provide a simulation model which is operable to: acquire throughput information associated with a throughput of a plurality of substrates within a lithographic apparatus, said throughput information comprising a throughput parameter; predict the throughput of the metrology system using the throughput parameter as input parameter. The simulation model may be calibrated using the acquired throughput information and/or be used to determine the throughput impact of at least one change of a throughput parameter.

It is to be noted that the term throughput information will be used in the following to refer to any information associated with the throughput of the metrology system or the lithographic apparatus. By way of example, this may include, but is not limited to, throughput numbers for the lithographic apparatus and/or the metrology system, and sampling performance, i.e. the quantity of successfully sampled substrates, of the lithographic apparatus.

The simulation model, in an embodiment, may perform simulation on historical data from the lithographic apparatus. The historical data may be conditioned or extrapolated prior to being used as an input to the simulation. The data input to the simulation may comprise statistical data. This may be derived from historical data, future production plans, and/or from equipment throughput roadmaps. Such simulations may be performed off-line, with the results used in subsequent lithographic processes.

Alternatively, in an embodiment, the simulation model may operate on-line during lithographic processing and metrology of substrates. In such an embodiment, the results can be used in real-time monitoring and control of the lithographic and metrology processes.

The throughput simulator disclosed herein may be implemented in a SCS or LACU as shown in FIG. 9, or any other suitable controller/control module (e.g. litho cluster equipment controller or litho cell controller). Alternatively it may be implemented in a manufacturer's Manufacturing Execution System (MES). In a further alternative embodiment the throughput simulator may be implemented in a controller of the metrology system.

The embodiments may further be described using the following clauses:

1. A metrology tool comprising:
    a substrate table to hold a substrate;
    a projection system configured to project a beam on a target portion of the substrate;
    an actuator configured to adjust a position of the projection system relative to the substrate on the substrate table;
    a sensor configured to determine a position of the substrate table; and
    a one or more processors configured to:
        determine, based on the position of the substrate table, a position error of the substrate table with respect to a reference; and
        control, via the actuator, a position of the projection system to compensate for the position error of the substrate table so that the beam projects on the target portion of the substrate.

2. The metrology tool of clause 1, wherein the one or more processors is further configured to:
move, via another actuator, the substrate table to a first position.

3. The metrology tool of clause 2, wherein the substrate table is moved within an accuracy range of ±300 µm with respect to a target position.

4. The metrology tool of clause 2, wherein the one or more processors is configured to:
determine, based on the first position, the position error of the substrate table with respect to a target position;
determine, based on the position error, an adjustment amount by which the projection system be moved to compensate for the position error of the substrate; and
control, via the actuator, the position of the projection system by the adjustment amount.

5. The metrology tool of clause 1, further comprises:
another sensor configured to determine a position of the projection system with respect to a frame on which the projection system is mounted.

6. The metrology tool of clause 5, wherein the one or more processors is further configured to:
control, based on the position error of the substrate table and the position of the projection system, the position of the projection system to compensate for the position error of the substrate table so that the beam projects on the target portion of the substrate.

7. The metrology tool of clause 1, wherein
the projection system is configured to capture an image of the target portion of the substrate; and
the one or more processors is further configured to:
determine, based on the image, a position of the projection system relative to the target portion of the substrate; and
control, based on the position error of the substrate table and the determined position of the projection system, the position of the projection system to compensate for the position error of the substrate table so that the beam projects on the target portion of the substrate.

8. The metrology tool of any of clauses 1-7, wherein the actuator is at least one of: a piezo-electric actuator, or a Lorentz actuator.

9. The metrology tool of any of clauses 1-8, wherein the position of the projection system is controlled with a position accuracy of ±2 µm with respect to the target position.

10. The metrology tool of any of clauses 1-9, wherein the actuator is configured to control the position of the projection system within a plane of the substrate.

11. The metrology tool of any of the clauses 1-10, wherein the actuator is configured to move the projection system in a linear direction.

12. The metrology tool of the clause 11, wherein the linear direction is an x-direction and/or a y-direction within a plane of the substrate.

13. The metrology tool of any of clauses 1-11, wherein the actuator is positioned to move the projection system in an angular direction by tilting the projection system to cause the beam to project at the target portion within a plane of the substrate.

14. The metrology tool of any of the clauses 1-13, wherein the one or more processors is at least one of:
a proportional (P) controller configured to determine an adjustment amount by which the projection system be moved to compensate for the position error of the substrate table;
an integral (I) controller configured to determine the adjustment amount by which the projection system be moved to compensate for the position error of the substrate table;
a differential (D) controller configured to determine the adjustment amount by which the projection system be moved to compensate for the position error of the substrate table; or
PID controller configured to determine the adjustment amount by which the projection system be moved to compensate for the position error of the substrate table.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made as described without departing from the scope of the claims set out below.

The invention claimed is:

1. A metrology tool comprising:
a substrate table of the metrology tool, the substrate configured to hold a substrate;
a projection system of the metrology tool, the projection system configured to project a measurement or inspection beam on a target portion of the substrate;
an actuator configured to adjust a position of the projection system relative to the substrate on the substrate table;
a sensor configured to determine a position of the substrate table; and
one or more processors configured to:
determine, based on the position of the substrate table, a position error of the substrate table with respect to a reference; and
control, via the actuator, a position of the projection system to compensate for the position error of the substrate table so that the beam projects on the target portion of the substrate.

2. The metrology tool of claim 1, wherein the one or more processors is further configured to cause movement, via another actuator, the substrate table to a first position.

3. The metrology tool of claim 2, configured to move the substrate table within an accuracy range of ±300 pm with respect to a target position.

4. The metrology tool of claim 2, wherein the one or more processors is configured to:
determine, based on the first position, the position error of the substrate table with respect to a target position;
determine, based on the position error, an adjustment amount by which the projection system be moved to compensate for the position error of the substrate; and
control, via the actuator, the position of the projection system by the adjustment amount.

5. The metrology tool of claim 1, further comprises another sensor configured to determine a position of the projection system with respect to a frame on which the projection system is mounted.

6. The metrology tool of claim 5, wherein the one or more processors is further configured to control, based on the position error of the substrate table and the position of the projection system, the position of the projection system to compensate for the position error of the substrate table so that the beam projects on the target portion of the substrate.

7. The metrology tool of claim 1, wherein:
the projection system is configured to capture an image of the target portion of the substrate; and
the one or more processors is further configured to:
determine, based on the image, a position of the projection system relative to the target portion of the substrate; and
control, based on the position error of the substrate table and the determined position of the projection system, the position of the projection system to compensate for the position error of the substrate table so that the beam projects on the target portion of the substrate.

8. The metrology tool of claim 1, wherein the actuator is a piezo-electric actuator, or a Lorentz actuator.

9. The metrology tool of claim 1, configured to control the position of the projection system with a position accuracy of ±2 pm with respect to a target position.

10. The metrology tool of claim 1, wherein the actuator is configured to control the position of the projection system within a plane parallel to a plane of the substrate.

11. The metrology tool of the claim 1, wherein the actuator is configured to move the projection system in a linear direction.

12. The metrology tool of the claim 11, wherein the linear direction is an x-direction and/or a y-direction within a plane parallel to a plane of the substrate.

13. The metrology tool of claim 1, wherein the actuator is positioned to move the projection system in an angular direction by tilting the projection system to cause the beam to project at the target portion within a plane of the substrate.

14. The metrology tool of claim 1, wherein the one or more processors is at least one selected from:
a proportional (P) controller configured to determine an adjustment amount by which the projection system be moved to compensate for the position error of the substrate table;
an integral (I) controller configured to determine an adjustment amount by which the projection system be moved to compensate for the position error of the substrate table;
a differential (D) controller configured to determine an adjustment amount by which the projection system be moved to compensate for the position error of the substrate table; or
a PID controller configured to determine an adjustment amount by which the projection system be moved to compensate for the position error of the substrate table.

15. A method comprising:
obtaining, based on a measured position of a substrate table holding a substrate, a position error of the substrate table with respect to a reference; and
controlling a position of a projection system, used to project a measurement or inspection beam on a target portion of the substrate, relative to the substrate table to compensate for the position error of the substrate table so that the beam projects on the target portion of the substrate.

16. The method of claim 15, further comprising:
moving the substrate table to a first position,
determining, based on the first position, the position error of the substrate table with respect to a target position;
determining, based on the position error, an adjustment amount by which the projection system be moved to compensate for the position error of the substrate; and
controlling the position of the projection system by the adjustment amount.

17. The method of claim 15, further comprising:
determining a position of the projection system with respect to a frame on which the projection system is mounted; and
controlling, based on the position error of the substrate table and the position of the projection system, the position of the projection system to compensate for the position error of the substrate table so that the beam projects on the target portion of the substrate.

18. The method of claim 15, further comprising moving the substrate table within an accuracy range of ±300 pm with respect to a target position.

19. The method of claim 15, further comprising:
capturing an image of the target portion of the substrate using the projection system;
determining, based on the image, a position of the projection system relative to the target portion of the substrate; and
controlling, based on the position error of the substrate table and the determined position of the projection system, the position of the projection system to compensate for the position error of the substrate table so that the beam projects on the target portion of the substrate.

20. The method of claim 15, comprising controlling the position of the projection system with a position accuracy of ±2 pm with respect to a target position.

* * * * *